(12) United States Patent
Mori

(10) Patent No.: US 6,275,179 B1
(45) Date of Patent: Aug. 14, 2001

(54) DIGITAL TO ANALOG CONVERTER USING A CURRENT MATRIX SYSTEM

(75) Inventor: Hiroyuki Mori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/358,368

(22) Filed: Jul. 21, 1999

(30) Foreign Application Priority Data

Jul. 23, 1998 (JP) .................................................. 10-207480

(51) Int. Cl.[7] .............................. H03M 1/66; H03M 1/76
(52) U.S. Cl. ............................................ 341/144; 341/148
(58) Field of Search ................................... 341/144, 148; 327/403–405, 407–412, 361, 355

(56) References Cited

U.S. PATENT DOCUMENTS

| | | | | |
|---|---|---|---|---|
| 4,683,458 | * | 7/1987 | Hallgren | 341/127 |
| 5,243,347 | * | 9/1993 | Jackson et al. | 341/144 |
| 5,387,912 | * | 2/1995 | Bowers | 341/118 |
| 5,541,597 | * | 7/1996 | Chi-Mao | 341/118 |
| 5,815,103 | * | 9/1998 | Comminges et al. | 341/144 |
| 6,002,354 | * | 12/1999 | Itoh et al. | 341/144 |

\* cited by examiner

Primary Examiner—Michael Tokar
Assistant Examiner—James H. Cho
(74) Attorney, Agent, or Firm—Jones Volentine, PLLC

(57) ABSTRACT

A first current cell group of an digital-to-analog converter has a first set of current cells which individually turn on and off in response to respectively input digital signals. A second current cell group of the analog-to-digital converter has a second set of current cells which respectively correspond to the first set of current cells and which individually turn on and off in response to respectively input digital signals such that an on/off state of each of the first set of current cells is opposite an on/off state of each corresponding one of the second set of current cells. The first set of currents cells are connected in parallel between a first power supply voltage and a first node, and the second set of currents cells are connected in parallel between the first node and a second power supply voltage. An output circuit generates an analog signal from either the current flowing from the first current cell group to the first node, or the current flowing from the first node to the second current cell group.

6 Claims, 5 Drawing Sheets

DIGITAL TO ANALOG CONVERTER USING A CURRENT MATRIX SYSTEM

BACKGROUND OF THE INVENTION

1. Field of the Invention

The present invention generally relates to a digital-to-analog converter, and more particularly, the present invention relates to a digital-to-analog converter using a current matrix system.

This application is a counterpart application of Japanese application Serial Number 207480/1998, filed Jul. 23, 1998, the subject matter of which is incorporated herein by reference.

2. Description of the Related Art

A digital-to-analog converter, using a current matrix system, converts inputted digital code to an analog voltage using a plurality of current cells. This device can achieve high conversion rates, and is mainly used for a video field.

FIG. 1 is a circuit diagram showing a conventional digital-to-analog converter.

As shown in FIG. 1, a current cell group 1 is made up of plural current cells CP1–CPk (k: an integral number, $k \geq 2$) connected in a parallel between a power supply voltage VDD and a node A. A current cell CPi (i: any integral number, from 1 to k) flows a current IP when turning on and off in response to individual inputted digital signals CNTPi. The current cell CPi is made up of a circuit so that a constant current PMOS transistor MP1 connects a switching PMOS transistor MP2 in series. A gate of the constant current PMOS transistor MP1 is connected to a node B that is supplied a bias voltage VBP from an external bias circuit. Individual digital signals CNTPi are inputted to a gate of the switching PMOS transistor MP2. Further, an output circuit is made up of a resistance R1 located between the node A as an output terminal of an analog output voltage VOUT and a ground potential VSS.

When the individual digital signal CNTPi changes to an L level, the switching PMOS transistor MP2 turns on and the constant current PMOS transistor MP1 flows a constant current IP to the resistance R1. When at least one of the plural current cells CP1–CPk is selected in response to the individual digital signal CNTPi, a current flows to the resistance R1 as follows:

IP×(the number of selected current cells)

The analog output voltage VOUT has a value as follows:

VOUT=IP× (the number of selected current cells)×R1

In the conventional digital-to-analog converter, it is desirable to increase the amplitude of an analog output voltage and to improve a linear property of an analog output voltage characteristic.

SUMMARY OF THE INVENTION

An object of the present invention is to provide a digital-to-analog converter that can improve the amplitude of the analog output voltage.

According to one aspect of the present invention, for achieving the above object, there is provided a digital-to-analog converter comprising:

a first current cell group which includes a first plurality of current cells for respectively turning on and turning off in response to individually inputted digital signal and which is connected between a first power supply voltage and a first node, wherein the plurality of first current cells are connected in parallel;

a second current cell group which includes a second plurality of current cells for respectively turning on and turning off in response to individually inputted digital signals and opposite the plurality of the first current cells, and which is connected between a second power supply voltage and the first node, wherein the plurality of second current cells are connected in parallel;

an output circuit which converts a current flowing from the first current cell group to the first node, or a current flowing from the first node to the first current cell group, into an analog signal;

wherein each first current cell includes a first conductive type constant current MOS transistor having a gate electrode which is supplied with a first bias voltage from a second node and each second current cell includes a second conductive type constant current MOS transistor having a gate electrode which is supplied with a second bias voltage from a third node.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which;

DETAILED DESCRIPTION OF THE PREFERRED EMBODIMENTS

A digital-to-analog converter according to the present invention will hereinafter be described in detail with reference to the accompanying drawings.

Figure 1:
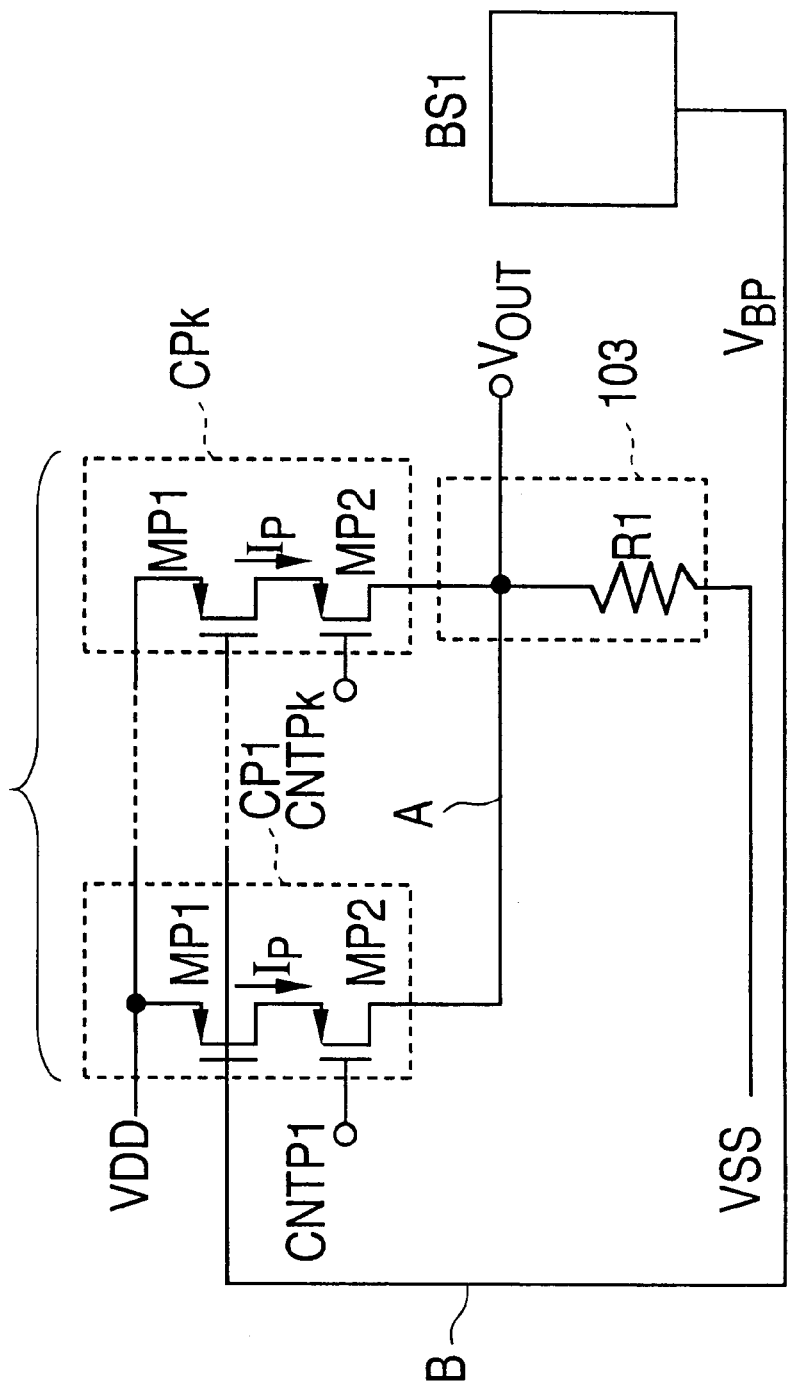
FIG. 1 is a circuit diagram showing a conventional digital-to-analog converter.
Figure 2:
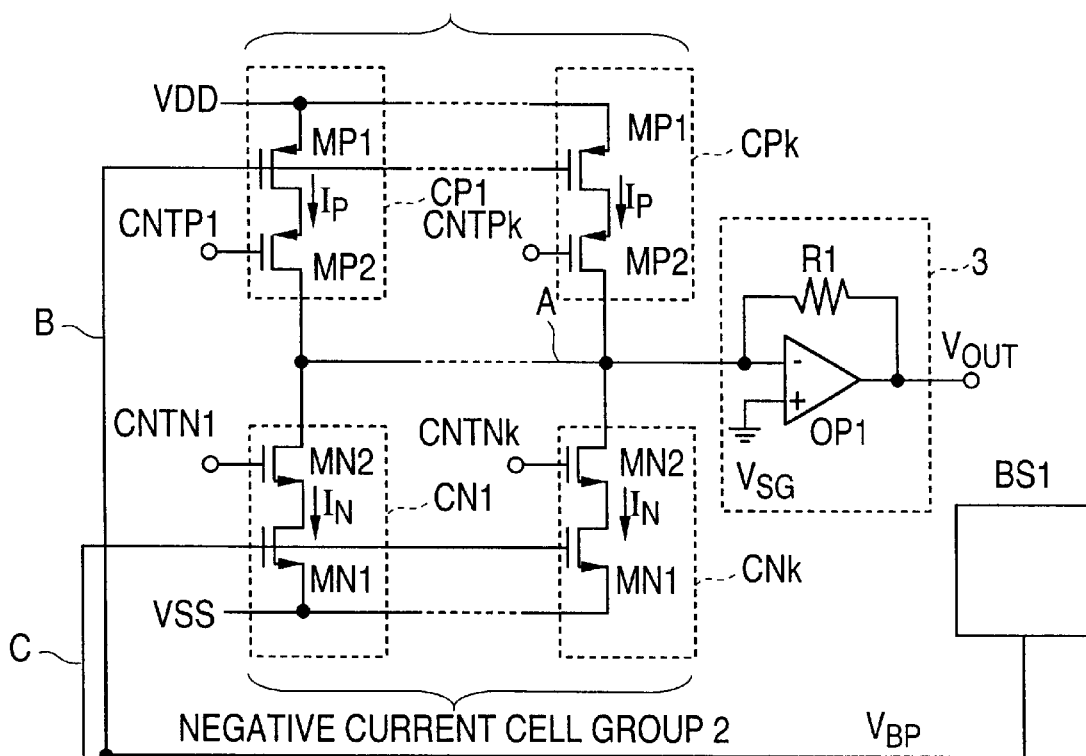
FIG. 2 is a circuit diagram showing a digital-to-analog converter according to a first preferred embodiment of the present invention.
Figure 2:
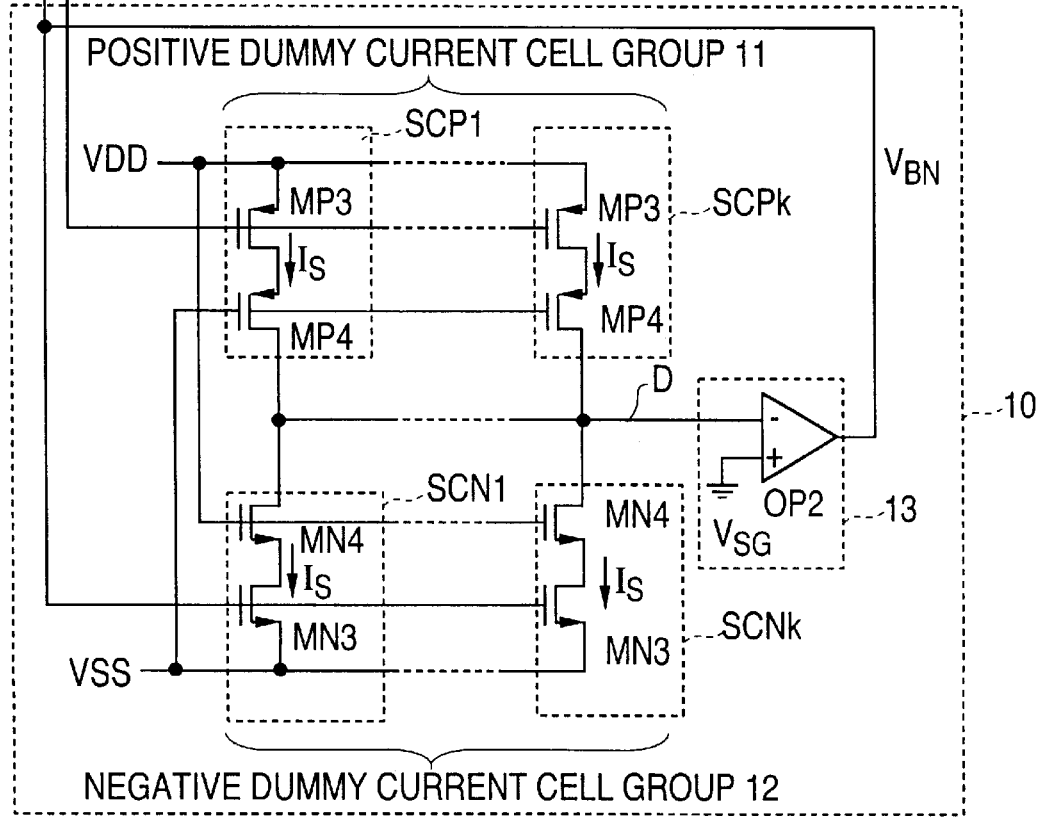

FIG. 2 is a circuit diagram showing a digital-to-analog converter according to a first preferred embodiment of the present invention.

As shown in FIG. 2, a digital-to-analog converter of a first preferred embodiment is preferably made up of a positive current cell group 1, a negative current cell group 2, an output circuit 3, and a constant current compensating bias circuit 10.

The positive current cell group 1 is preferably made up of plural positive current cells CP1–CPk (k: integral number, $k \geq 2$) connected in parallel between power supply voltage VDD and a node A. The positive current cells CP1–CPk respectively turn on and off in response to individual inputted digital signals CNTPk (k: integral number, $k \geq 2$). When each of the positive current cells CP1–CPk turns on, a current IP flows. Each of the positive current cells CP1–CPk is preferably made up of a constant current PMOS transistor MP1 and a switching PMOS transistor MP2. The constant current PMOS transistor MP1 is connected in series with the switching PMOS transistor MP2. A source electrode of the constant current PMOS transistor MP1 is connected to the power supply voltage VDD. A gate electrode of the constant current PMOS transistor MP1 is connected to a node B supplying a positive bias voltage VBP from an external bias circuit BS1. A source electrode of the switching PMOS transistor MP2 is connected to a drain electrode of the constant current PMOS transistor MP1. The individual inputted digital signals CNTPk are inputted to the gate electrode of the switching PMOS transistor MP2. A drain electrode of the switching PMOS transistor MP2 is connected to the node A.

The negative current cell group 2 is preferably made up of plural negative current cells CN1–CNk (k: integral number, k≧2) connected in parallel between a power supply voltage VSS (VSS<VDD) and the node A. The negative current cells CN1–CNk respectively turn on and off in response to individual inputted digital signals CNTNk (k: integral number, k≧2). When each of the negative current cells CN1–CNk turns on, a current IN flows. Each of the negative current cells CN1–CNk is preferably made up of a constant current NMOS transistor MN1 and a switching NMOS transistor MN2. The constant current NMOS transistor MN1 is connected in series with the switching NMOS transistor MN2. A source electrode of the constant current NMOS transistor MN1 is connected to the power supply voltage VSS. A gate electrode of the constant current NMOS transistor MN1 is connected to a node C supplying a negative bias voltage VBN from the bias compensating circuit 10. A source electrode of the switching NMOS transistor MN2 is connected to a drain electrode of the constant current NMOS transistor MN1. The individual inputted digital signals CNTNk are inputted to the gate electrode of the switching NMOS transistor MN2. A drain electrode of the switching NMOS transistor MN2 is connected to the node A.

The output circuit 3 is preferably made up of an output operational amplifier OP1 having a feedback resistance R1. A negative input terminal of the output operational amplifier OP1 is connected to the node A. A positive input terminal of the output operational amplifier OP1 is connected to the ground potential VSG. The feedback resistance R1 is connected between the negative input terminal of the output operational amplifier OP1 and an output terminal of the output operational amplifier OP1. The output terminal of the output operational amplifier OP1 serves as an analog output voltage VOUT. Here, VSG=(VDD−VSS)/2. A positive power supply voltage terminal (not shown) of the output operational amplifier OP1 is connected to the power supply voltage VDD. A negative power supply voltage terminal (not shown) of the output operational amplifier OP1 is connected to the power supply voltage VSS.

The constant current compensating bias circuit 10 is preferably made up of a positive dummy current cell group 11, a negative dummy current cell group 12, and a constant current compensating bias generating circuit 13 having a constant current compensating operational amplifier OP2.

The positive dummy current cell group 11 is preferably made up of plural positive current cells SCP1–SCPk (k: integral number, k≧2) connected in parallel between a power supply voltage VDD and the node D. Each of the plural positive current cells SCP1–SCPk is turned on, constantly. Each of the plural positive current cells SCP1–SCPk is made up of a constant current PMOS transistor MP3 and a constant current PMOS transistor MP4. The constant current PMOS transistor MP3 is connected in series with the constant current PMOS transistor MP4.

The constant current PMOS transistor MP3 is the same as the constant current PMOS transistor MP1 of the positive current cell CPk. The constant current PMOS transistor MP4 is the same as a switching transistor MP2 of the positive current cell CPk. A source electrode of the constant current PMOS transistor MP3 is connected to the power supply voltage VDD. A gate electrode of the constant current PMOS transistor MP3 is connected to the node B supplying the positive bias voltage VBP. The constant current PMOS transistor MP4 is turned on, constantly. A source electrode of the constant current PMOS transistor MP4 is connected to a drain electrode of the constant current PMOS transistor MP3. A gate electrode of the constant current PMOS transistor MP4 is connected to the power supply voltage VSS.

Therefore, the plural positive current cells SCP1–SCPk are equivalent to the positive current cell CPk turning on, constantly.

The negative dummy current cell group 12 is preferably made up of plural negative current cells SCN1–SCNk (k: integral number, k≧2) connected in parallel between a power supply voltage VSS and the node D. Each of the plural negative current cells SCN1–SCNK is turned on, constantly. Each of the plural negative current cells SCN1–SCNk is made up of a constant current NMOS transistor MN3 and a constant current NMOS transistor MN4. The constant current NMOS transistor MN3 is connected in series with the constant current NMOS transistor MN4.

The constant current NMOS transistor MN3 is the same as the constant current NMOS transistor MN1 of the negative current cell CNk. The constant current NMOS transistor MN4 is the same as a switching transistor M2 of the negative current cell CNk. A source electrode of the constant current NMOS transistor MN3 is connected to the power supply voltage VSS. A gate electrode of the constant current NMOS transistor MN3 is connected to the node C supplying the negative bias voltage VBN. The constant current NMOS transistor MN4 is turned on, constantly. A source electrode of the constant current NMOS transistor MN4 is connected to a drain electrode of the constant current NMOS transistor MN3. A gate electrode of the constant current NMOS transistor MN4 is connected to the power supply voltage VDD.

The constant current compensating operational amplifier OP2 generates the negative bias voltage VBN and supplies the negative bias voltage VBN to the node C so that the current IP of the positive current cell CPk is the same as the current IN of the negative current cell CNk. A negative input terminal of the constant current compensating operational amplifier OP2 is connected to the node D. A positive input terminal of the constant current compensating operational amplifier OP2 is connected to the ground potential VSG. An output terminal of the constant current compensating operational amplifier OP2 is connected to the node C.

Operations for the digital-to-analog converter according to the first preferred embodiment are follow as:

When the digital signal CNTPk changes to an H level, the transistor MP2 turns off the positive current cell CPk. When the digital signal CNTPK changes to an L level, the transistor MP2 turns on the positive current cell CPk. At this time, the transistor MP1 flows the current IP responding to the positive bias voltage VBP.

When the digital signal CNTNk changes to an H level, the transistor MN2 turns off the negative current cell CNk.

When the digital signal CNTNk changes to an L level, the transistor MN2 turns on the negative current cell CNk. At this time, the transistor MN1 flows the current IN responding to the negative bias voltage VBN.

Here, the positive current cell CPk and the negative current cell CNk do not turn on at the same time. Therefore, when the positive current cell CPk has been selected, the negative current cell CNk is not selected. When the negative current cell CNk has been selected, the positive current cell CPk is not selected.

When the positive current cell CPk is selected, a current flowing from the positive current cell group 1 to the output circuit 3 is as follows:

IP×(the number of the selected positive current cell CPk)

Since the operation amplifier OP1 fixes the ground potential VSG a potential of the node A. Accordingly, the analog output voltage VOUT is as follows:

VOUT=−IP×(the number of the selected positive current cell CPk)×R1

When the negative current cell CNk is selected, a current flowing from the negative current cell group 2 to the output circuit 3 is as follows:

IN×(the number of the selected negative current cell CNk)

The analog output voltage VOUT is as follows:

VOUT=IN×(the number of the selected negative current cell CNk)×R1

For example, when the number of the selected positive current cell CPk is three, a current of 3×IP flows from the positive current cell group 1 to the output circuit 3. Consequently, the analog output voltage VOUT is as follows:

VOUT=−3×IP×R1

For example, when the all negative current cells CNk are selected, a current of k×IP flows from the negative current cell group 2 to the output circuit 3. Consequently, the analog output voltage VOUT is as follows:

VOUT=k×IN×R1

Here, in the analog output voltage VOUT, k×IN×R1 is a maximum value and −k×IN×R1 is a minimum value.

The resistance R1 can make the maximum value similar to the power supply voltage VDD in the operational amplifier OP1. Further, the resistance R1 can make the minimum value similar to the power supply voltage VSS in the operational amplifier OP1. Consequently, the amplitude of the analog output voltage VOUT is about VDD−VSS.

In the bias compensating circuit 10, when all of the positive dummy current cells SCPk and the negative dummy current cell SCNK turn on, the current IS flows to all of the positive dummy current cells SCPk and the negative dummy current cell SCNK.

Since the same bias voltage VBP is supplied to the positive current cell CPk and the positive dummy current cell SCPk, the positive dummy current cell SCPk is equal to the positive current cell CPk in the equivalent impedance.

Since the same bias voltage VBN is supplied to the negative current cell CNk and the negative dummy current cell SCNk, the negative dummy current cell SCNk is equal to the negative current cell CNk in the equivalent impedance.

Here, since the operational amplifier OP1 fix VSG (=(VDD−VSS)/2) the node A, a voltage given to the positive current cell CPk is the same as that of the negative current cell CNk. Accordingly, when turning on, if the equivalent impedance of the positive constant current CPk is the same as that of the negative constant current CNk, the constant current IP of the positive current cell CPk can be made the same as the constant current IN of the negative current cell CNk.

Since the equivalent impedance of the positive constant current CPk can be made the same as that of the negative constant current CNk, the equivalent impedance of the positive dummy constant current SCPk can be made the same as that of the negative dummy constant current SCNk. When the equivalent impedance of the positive dummy constant current ScPk is the same as that of the negative dummy constant current SCNk, a potential of the node D becomes VSG (=(VDD−VSS)/2).

Accordingly, by controlling the positive bias voltage VBP or the negative bias voltage VBN so that the potential of the node D becomes VSG, the constant current IP of the positive current cell CPk can be made the same as the constant current IN of the negative current cell CNk. In the bias compensating circuit 10, the operational amplifier OP2 controls the negative bias voltage VBN so that the potential of the node D becomes VSG.

As mentioned above, the first preferred embodiment of the present invention can improve the amplitude of the analog output voltage VOUT. Further, by using the operational amplifier OP2 of the bias compensating circuit 10 to control the negative bias voltage VBN so that the potential of the node D becomes VSG, the constant current IP of the positive current cell CPk can constantly be made the same as the constant current IN of the negative current cell CNk. Accordingly, the character of the analog output voltage against the digital input code can be made linear at all times.

Figure 3:
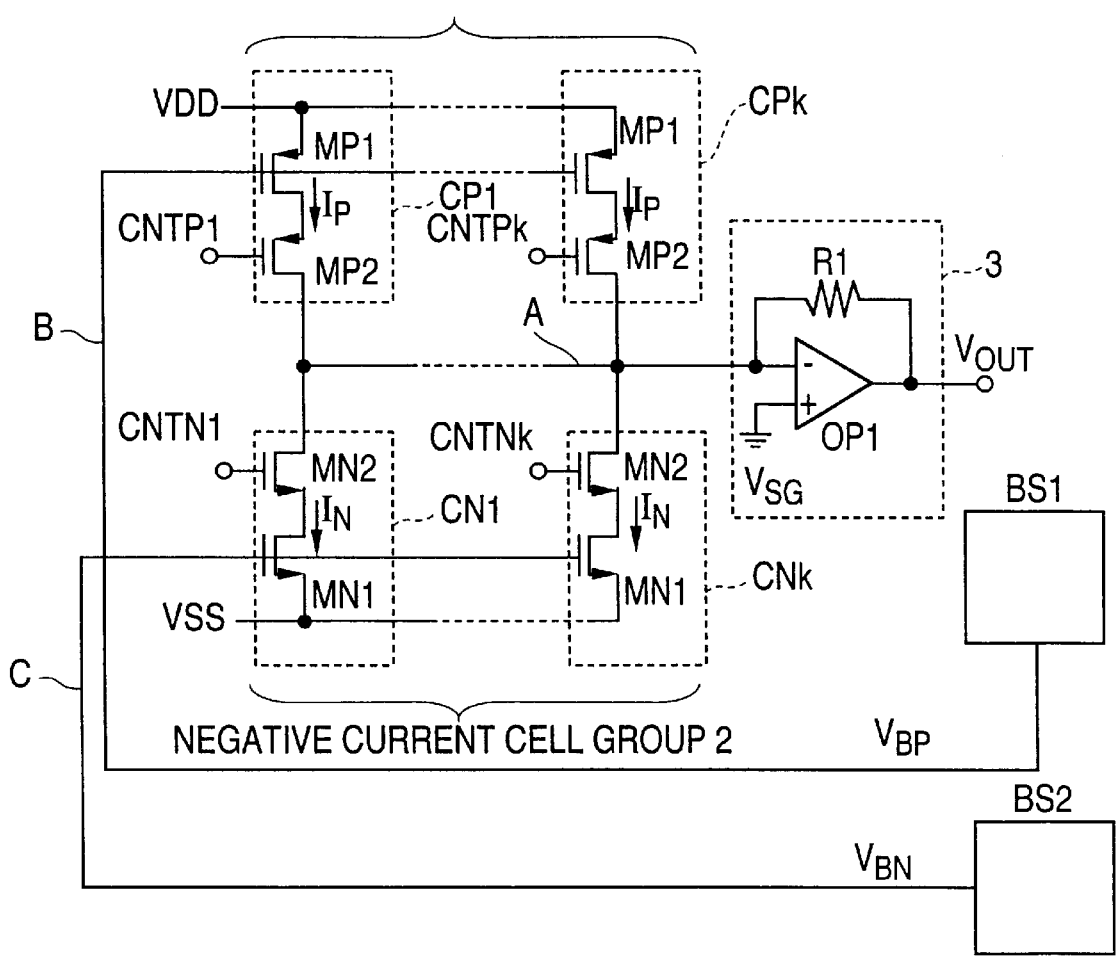
FIG. 3 is a circuit diagram showing a digital-to-analog converter according to a second preferred embodiment of the present invention.

FIG. 3 is a circuit diagram showing a digital-to-analog converter according to the second preferred embodiment of the present invention.

As shown in FIG. 3, the digital-ro-analog converter according to the second preferred embodiment is characterized by the supply of the negative bias voltage VBN from an external bias circuit BS2 to the node C, instead of using the bias compensating circuit 10.

Operations for the digital-to-analog converter according to the second preferred embodiment are follow as:

When the digital signal CNTPk changes to an H level, the transistor MP2 turns off the positive current cell CPk. When the digital signal CNTPk changes to an L level, the transistor MP2 turns on the positive current cell CPk. At this time, the transistor MP1 flows the current IP responding to the positive bias voltage VBP.

When the digital signal CNTNk changes to an H level, the transistor MN2 turns off the negative current cell CNk. When the digital signal CNTNk changes to an L level, the transistor MN2 turns on the negative current cell CNk. At this time, the transistor MN1 flows the current IN responding to the negative bias voltage VBN.

Here, the positive current cell CPk and the negative current cell CNk do not turn on at the same time. Therefore, when the positive current cell CPk has been selected, the negative current cell CNk is not selected. When the negative current cell CNk has been selected, the positive current cell CPk is not selected.

When the positive current cell CPk is selected, a current flowing from the positive current cell group 1 to the output circuit 3 is as follows:

IP×(the number of the selected positive current cell CPk)

The operational amplifier OP1 fixes the ground potential VSG a potential of the node A. Accordingly, the analog output voltage VOUT is as follows:

VOUT=−IP×(the number of the selected positive current cell CPk)×R1

When the negative current cell CNk is selected, a current flowing from the negative current cell group 2 to the output circuit 3 is as follows:

IN×(the number of the selected negative current cell CNk)

The analog output voltage VOUT is as follows:

VOUT=IN×(the number of the selected negative current cell CNk)×R1

For example, when the number of the selected positive current cell CPk is three, a current of 3×IP flows from the positive current cell group 1 to the output circuit 3. Consequently, the analog output voltage VOUT is as follows:

VOUT=−3×IP×R1

For example, when the all negative current cell CNk are selected, a current of k×IP flows from the negative current cell group 2 to the output circuit 3. Consequently, the analog output voltage VOUT is as follows:

VOUT=k×IN×R1

Here, in the analog output voltage VOUT, k×IN×R1 is a maximum value and −k×IN×R1 is a minimum value.

The resistance R1 can make the maximum value similar to the power supply voltage VDD in the operational amplifier OP1. Further, the resistance R1 can make the minimum value similar to the power supply voltage VSS in the operational amplifier OP1. Consequently, the amplitude of the analog output voltage VOUT is about VDD−VSS.

As mentioned above, the second preferred embodiment of the present invention can improve the amplitude of the analog output voltage VOUT due to the positive current cell group 1 and the negative current cell group 2.

Figure 4:
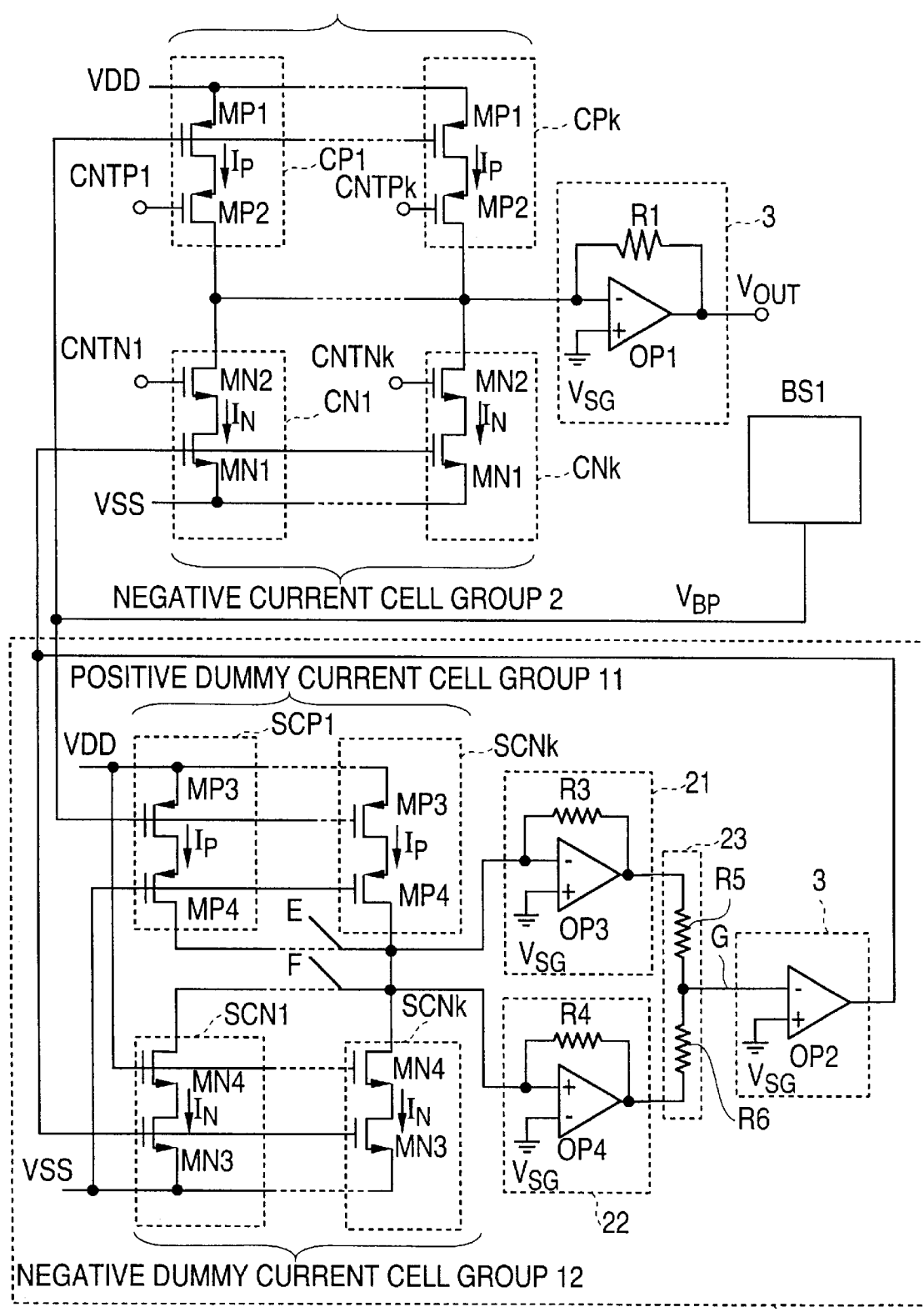
FIG. 4 is a circuit diagram showing a digital-to-analog converter according to a third preferred embodiment of the present invention.

FIG. 4 is a circuit diagram showing a digital-to-analog converter according to the third preferred embodiment of the present invention.

As shown in FIG. 4, a digital-to-analog converter of a third preferred embodiment is preferably made up of a positive current cell group 1, a negative current cell group 2, an output circuit 3, and a constant current compensating bias circuit 20.

The positive current cell group 1 is preferably made up of plural positive current cells CP1–CPk (k: integral number, k≧2) connected in parallel between a power supply voltage VDD and a node A. The positive current cells CP1–CPk respectively turn on and off in response to individual inputted digital signals CNTPk (k: integral number, k≧2). When each of the positive current cells CP1–CPk turns on, a current IP flows. Each of the positive current cells CP1–CPk is preferably made up of a constant current PMOS transistor MP1 and a switching PMOS transistor MP2. The constant current PMOS transistor MP1 is connected in series with the switching PMOS transistor MP2. A source electrode of the constant current PMOS transistor MP1 is connected to the power supply voltage VDD. A gate electrode of the constant current PMOS transistor MP1 is connected to a node B supplying a positive bias voltage VBP from an external bias circuit BS1. A source electrode of the switching PMOS transistor MP2 is connected to a drain electrode of the constant current PMOS transistor MP1. The individual inputted digital signals CNTPk are inputted to the gate electrode of the switching PMOS transistor MP2. A drain electrode of the switching PMOS transistor MP2 is connected to the node A.

The negative current cell group 2 is preferably made up of plural negative current cells CN1–CNk (k: integral number, k≧2) connected in parallel between a power supply voltage VSS (VSS<VDD) and the node A. The negative current cells CN1–CNk respectively turn on and off in response to individual inputted digital signals CNTNk (k: integral number, k≧2). When each of the negative current cells CN1–CNk turns on, a current IN flows. Each of the negative current cells CN1–CNk is preferably made up of a constant current NMOS transistor MN1 and a switching NMOS transistor MN2. The constant current NMOS transistor MN1 is connected in series with the switching NMOS transistor MN2. A source electrode of the constant current NMOS transistor MN1 is connected to the power supply voltage VSS. A gate electrode of the constant current NMOS transistor MN1 is connected to a node C supplying a negative bias voltage VBN from the bias compensating circuit 10. A source electrode of the switching NMOS transistor MN2 is connected to a drain electrode of the constant current NMOS transistor MN1. The individual inputted digital signals CNTNk are inputted to the gate electrode of the switching NMOS transistor MN2. A drain electrode of the switching NMOS transistor MN2 is connected to the node A.

The output circuit 3 is preferably made up of an output operational amplifier OP1 having a feedback resistance R1. A negative input terminal of the output operational amplifier OP1 is connected to the node A. A positive input terminal of the output operational amplifier OP1 is connected to the ground potential VSG. The feedback resistance R1 is connected between the negative input terminal of the output operational amplifier OP1 and an output terminal of the output operational amplifier OP1. The output terminal of the output operational amplifier OP1 serves as an analog output voltage VOUT. Here, VSG=(VDD−VSS)/2. A positive power supply voltage terminal (not shown) of the output operational amplifier OP1 is connected to the power supply voltage VDD. A negative power supply voltage terminal (not shown) of the output operational amplifier OP1 is connected to the power supply voltage VSS.

The constant current compensating bias circuit 20 is preferably made up of a positive dummy current cell group 11, a negative dummy current cell group 12, a positive dummy output circuit 21, a negative dummy output circuit 22, a voltage dividing circuit 23, and a constant current compensating bias generating circuit 13. In the constant current compensating bias circuit 20, the node D as shown in FIG. 2, is divided a node E, a node F, and a node G. The node E connected to a drain of the respective transistor MP4 in the positive dummy current cell SCPk, which is connected to the positive dummy output circuit 21. The node F connected to a drain of the respective transistor MN4 in the negative dummy current cell SCNk, which is connected to the negative dummy output circuit 22. The node G connected to a negative input terminal of the constant current compensating operational amplifier OP2, which is connected to the voltage dividing circuit 23.

The positive dummy output circuit 21 is preferably made up of a positive dummy outputting operational amplifier OP3 and a resistance R3. A negative input terminal of the positive dummy output circuit 21 is connected to the node E. A positive input terminal of the positive dummy output circuit 21 is connected to the ground potential VSG. The resistance R3 is connected between the negative input terminal and an output terminal. The positive dummy outputting operational amplifier OP3 and the resistance R3 are the same as the operational amplifier OP1 and the resistance R1 in the output circuit 3.

A positive power supply terminal (not shown) of the operational amplifier OP3 is connected to the power supply voltage VDD. A negative power supply terminal (not shown) of the operational amplifier OP3 is connected to the power supply voltage VSS. The positive dummy output circuit 21 serves as a dummy of the output circuit 3 when the positive current cell CPk is selected.

The negative dummy output circuit 22 is preferably made up of a positive dummy outputting operational amplifier OP4 and a resistance R4. A negative input terminal of the negative dummy output circuit 22 is connected to the node F. A positive input terminal of the negative dummy output circuit 22 is connected to the ground potential VSG. The resistance R4 is connected between the negative input terminal and an output terminal. The negative dummy outputting operational amplifier OP4 and the resistance R4 are the same as the operational amplifier OP1 and the resistance R1 in the output circuit 3.

A positive power supply terminal (not shown) of the operational amplifier OP4 is connected to the power supply voltage VDD. A negative power supply terminal (not shown) of the operational amplifier OP4 is connected to the power supply voltage VSS. The negative dummy output circuit 22 serves as a dummy of the output circuit 3 when the negative current cell CNk is Selected.

The voltage dividing circuit 23 outputs the node G a half voltage between a potential of the output terminal of the operational amplifier OP3 and a potential of the output terminal of the operational amplifier OP4. The voltage dividing circuit 23 is preferably made up of a resistance R5 and a resistance R6. The resistance R5 is the same as the resistance R6 in resistance value. The resistance R5 is connected between the output terminal of the operational amplifier OP3 and a node G. The resistance R6 is connected between the output terminal of the operational amplifier OP4 and a node G.

Operations for the digital-to-analog converter of the third preferred embodiment is as follows:

In the constant current compensating bias circuit 20, when all of the positive dummy current cell SCPk and the negative dummy current cell SCNk turn on, the current IP flows in the positive dummy current cell SCPk and the current IN flows in the negative dummy current cell SCNk.

Accordingly, a current flowing from the positive dummy current cell group 11 to the positive dummy output circuit 21 is as follows:

IP×k

Here, R3=R1. An output voltage of the operational amplifier OP3 is as follows:

−IP×k×R1

On the other hand, a current flowing from the negative dummy current cell group 12 to the negative dummy output circuit 22 is as follows:

IN×k

Here, R4=R1. An output voltage of the operational amplifier OP4 is as follows:

IN×k×R1

Here, R5=R6. A potential by an output of the voltage dividing circuit 23 is as follows:

(IN−IP)×k×R1/2

Accordingly, by controlling the positive bias voltage VBP or the negative bias voltage VBN so that the potential of the node G becomes VSG (=0[CV]), the constant current IP of the positive current cell CPk can be made the same as the constant current IN of the negative current cell CNk. In the bias compensating circuit 20, the operational amplifier OP2 controls the negative bias voltage VBN so that the potential of the node G becomes VSG.

As mentioned above, the third preferred embodiment of the present invention can improve the amplitude of the analog output voltage VOUT. Further, by using the operational amplifier OP2 of the bias compensating circuit 20 controls the negative bias voltage VBN so that the potential of the node G becomes VSG, the constant current IP of the positive current cell CPk can be made constantly the same as the constant current IN of the negative current cell CNk. Accordingly, the character of the analog output voltage against the digital input code can make linear at all times.

Further, since the third preferred embodiment of the present invention includes the dummy output circuits 21 and 22 which serve as dummy of the output circuit 3, it can compensate the non-linear characteristics of the analog output voltage even if the current IP is equal to the current IN.

Figure 5:
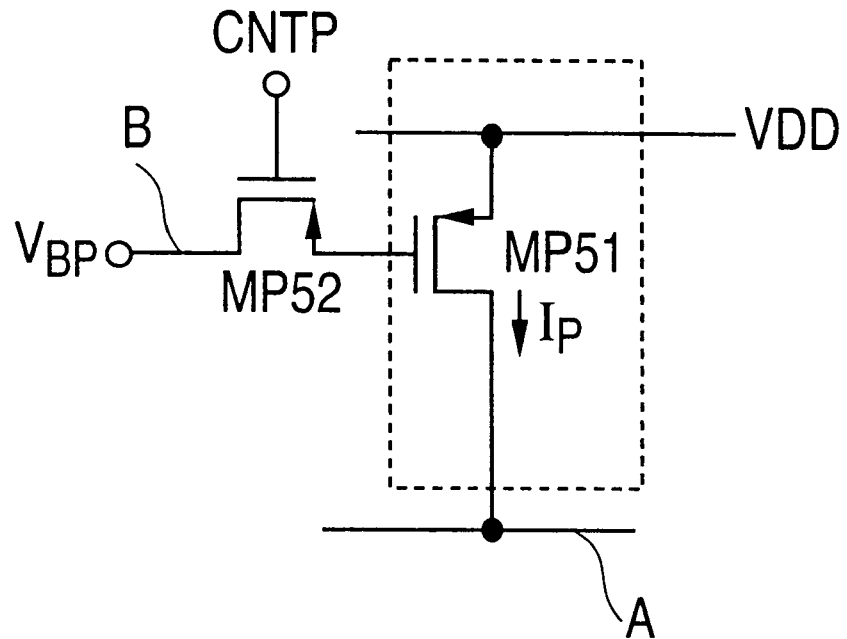
FIG. 5 is a circuit diagram showing a digital-to-analog converter according to an example of a positive current cell of the present invention.

FIG. 5 is a circuit diagram showing a digital-to-analog converter according to another example of a positive current cell of the present invention.

As shown in FIG. 5, a positive current cell is preferably made up of a constant current PMOS transistor MP51 and a switching PMOS transistor MP52. A source electrode of the constant current PMOS transistor MP51 is connected to a power supply voltage VDD. A drain electrode of the constant current PMOS transistor MP51 is connected to a node A.

A source electrode of the switching PMos transistor MP52 is connected to a gate electrode of the constant current PMOS transistor MP51. A drain electrode of the switching PMOS transistor MP52 is connected to a node B. A gate electrode of the switching PMOS transistor MP52 inputs a digital signal CNTP. Further, in a positive dummy current cell, the gate electrode of the switching PMOS transistor MP52 is connected to a power supply voltage VSS (VSS<VDD).

Figure 6:
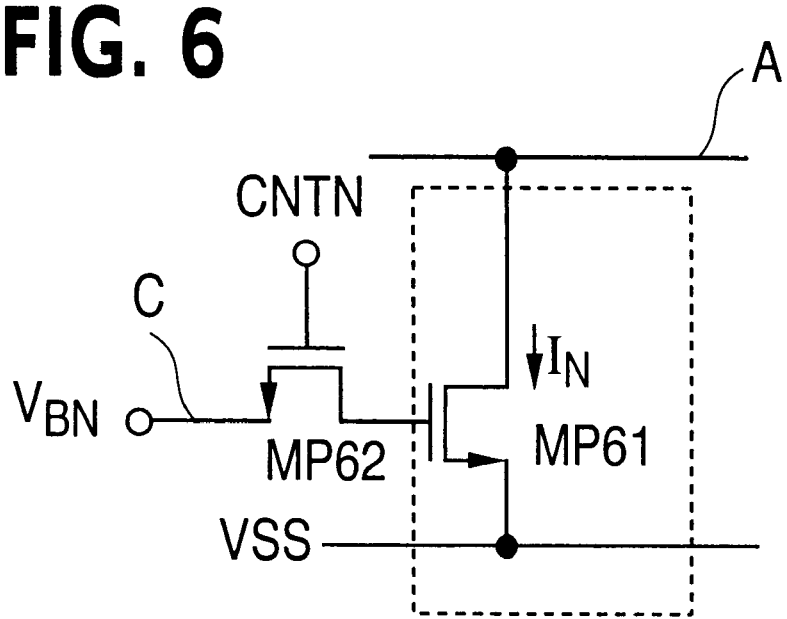
FIG. 6 is a circuit diagram showing a digital-to-analog converter according to an example of a negative current cell of the present invention.

FIG. 6 is a circuit diagram showing a digital-to-analog converter according to another example of a negative current cell of the present invention.

As shown in FIG. 6, a negative current cell is preferably made up of a constant current NMOS transistor MN61 and a switching NMOS transistor MN62. A source electrode of the constant current NMOS transistor MN61 is connected to a power supply voltage VSS. A drain electrode of the constant current NMOS transistor MN61 is connected to a node A.

A drain electrode of the switching NMOS transistor MN62 is connected to a gate electrode of the constant current NMOS transistor MN61. A source electrode of the switching NMOS transistor MN62 is connected to a node C. A gate electrode of the switching NMOS transistor MN62 inputs a digital signal CNTN. Further, in a negative dummy current cell. the gate electrode of the switching NMOS transistor MN62 is connected to a power supply voltage VDD (VSS<VDD).

While the present invention has been described with reference to the illustrative embodiments, this description is not intended to be construed in a limiting sense. Various modifications of the illustrative embodiments, as well as other embodiments of the invention, will be apparent to those skilled in the art with reference to this description. It is therefore contemplated that the appended claims will cover any such modifications or embodiments as fall within the true scope of the invention.

What is claimed is:

1. A digital-to-analog converter comprising:
   a first current cell group having a first plurality of current cells which individually turn on and off in response to respectively input digital signals, wherein the first plurality of currents cells are connected in parallel between a first power supply voltage and a first node;
   a second current cell group having a second plurality of current cells which respectively correspond to the first plurality of current cells, and which individually turn on and off in response to respectively input digital signals such that an on/off state of each of the first plurality of current cells is opposite an on/off state of each corresponding one of the second plurality of current cells, wherein the second plurality of currents cells are connected in parallel between the first node and a second power supply voltage;

an output circuit which converts a current flowing from the first current cell group to the first node, or a current flowing from the first node to the second current cell group, into an analog output voltage;

wherein each of the first plurality of current cells includes a first conductive type constant current MOS transistor having a gate electrode which is supplied with a first bias voltage from a second node, and wherein each of the second plurality of current cells includes a second conductive type constant current MOS transistor having a gate electrode which is supplied with a second bias voltage from a third node;

wherein the output circuit includes an operational amplifier having a negative input terminal connected with the first node, a positive input terminal connected with a ground potential, and an output terminal connected to the negative input terminal via a feedback resister; and wherein said digital-to-analog converter further comprises:
  a first dummy current cell group having a first plurality of dummy current cells which are constantly turned on, each of the first plurality of dummy current cells including a first conductive type constant current MOS transistor having a gate electrode connected with the second node, wherein the first plurality of dummy current cells are connected in parallel between the first power supply voltage and a fourth node;
  a second dummy current cell group having a second plurality of dummy current cells which are constantly turned on, each of the second plurality of dummy current cells including a second conductive type constant current MOS transistor having a gate electrode connected with the third node, wherein the second plurality of dummy current cells are connected in parallel between the fourth node and the second power supply voltage; and
  a constant current compensating operational amplifier having a negative input terminal connected with the fourth node, a positive input terminal connected with the ground potential, and an output terminal connected with the third node, wherein the constant current compensating operational amplifier supplies the second bias voltage to the third node to equalize a potential of the fourth node and the ground potential.

2. The digital-to-analog converter as claimed in claim 1,
wherein each of the first plurality of current cells further includes a first switching MOS transistor connected in series with the first conductive type constant current MOS transistor, and wherein the first switching MOS transistor includes a gate electrode which receives a digital signal;

wherein each of the first plurality of dummy current cells further includes a first conductive type MOS transistor connected in series with the first conductive type constant current MOS transistor, and wherein the first conductive type MOS transistor includes a gate electrode which is connected to the second power supply voltage;

wherein each of the second plurality of current cells further includes a second switching MOS transistor connected in series with the second conductive type constant current MOS transistor, and wherein the second switching MOS transistor includes a gate electrode which receives a digital signal; and wherein each of the second plurality of dummy current cells further includes a second conductive type MOS transistor connected in series with the second conductive type constant current MOS transistor, and wherein the second conductive type MOS transistor includes a gate electrode which is connected to the first power supply voltage.

3. The digital-to-analog converter as claimed in claim 1,
wherein each of the first plurality of current cells further includes a first switching MOS transistor connected between the second node and the gate electrode of the first conductive type constant current MOS transistor, and wherein the first switching MOS transistor includes a gate electrode which receives a digital signal;

wherein each of the first plurality of dummy current cells further includes a first conductive type MOS transistor connected between the second node and the gate electrode of the first conductive type constant current MOS transistor, and wherein the first conductive type MOS transistor includes a gate electrode which is connected to the second power supply voltage;

wherein each of the second plurality of current cells further includes a second switching MOS transistor connected between the third node and the gate electrode of the second conductive type constant current MOS transistor, and wherein the second switching MOS transistor includes a gate electrode which receives a digital signal; and wherein each of the second plurality of dummy current cells further includes a second conductive type MOS transistor connected between the third node and the gate electrode of the second conductive type constant current MOS transistor, and wherein the second conductive type MOS transistor includes a gate electrode which is connected to the first power supply voltage.

4. A digital-to-analog converter comprising:
a first current cell group which includes a first plurality of current cells for respectively turning on and turning off in response to individually inputted digital signals and which is connected between a first power supply voltage and a first node, the plurality of first current cells connecting in parallel;

a second current cell group which includes a second plurality of current cells for respectively turning on and turning off in response to individually inputted digital signals and which exclusively turns on against the plurality of the first current cells, the second current cell group connected between a second power supply voltage and the first node, and the plurality of second current cells connecting in parallel;

an output circuit which converts an analog output voltage to a current flowing from the first current cell group to the first node, or a current flowing from the first node to the first current cell group;

wherein each of the first plurality of current cells includes a first conductive type constant current MOS transistor having a gate electrode which is supplied with a first bias voltage from a second node, and wherein each of the second plurality of current cells includes a second conductive type constant current MOS transistor having a gate electrode which is supplied with a second bias voltage from a third node;

wherein the output circuit includes an operational amplifier having a negative input terminal connected with the first node, a positive input terminal connected with a ground potential, and an output terminal connected to the negative input terminal via a feedback resister; and wherein said digital-to-analog converter further comprises:

a first dummy current cell group having a first plurality of dummy current cells which are constantly turned on, each of the first plurality of dummy current cells including a first conductive type constant current MOS transistor having a gate electrode connected with the second node, wherein the first plurality of dummy current cells are connected in parallel between the first power supply voltage and a fourth node;

a second dummy current cell group having a second plurality of dummy current cells which are constantly turned on, each of the second plurality of dummy current cells including a second conductive type constant current MOS transistor having a gate electrode connected with the third node, wherein the second plurality of dummy current cells are connected in parallel between a fifth node and the second power supply voltage;

a first dummy output operational amplifier having a negative input terminal connected with the fourth node, a positive input terminal connected with the ground potential, and an output terminal connected with the negative input terminal via a feedback resistance;

a second dummy output operational amplifier having a negative input terminal connected with the fifth node, a positive input terminal connected with the ground potential, and an output terminal connected with the negative input terminal via a feedback resistance;

a voltage dividing circuit which divides a potential between the output terminals of the first and second dummy output operational amplifiers, and which outputs the divided potential to a sixth node; and a constant current compensating operational amplifier having a negative input terminal connected with the sixth node, a positive input terminal connected with the ground potential, and an output terminal connected with the third node, wherein the constant current compensating operational amplifier supplies the second bias voltage to the third node to equalize a potential of the sixth node and the ground potential.

5. The digital-to-analog converter as claimed in claim 4, wherein each of the first plurality of current cells further includes a first switching MOS transistor connected in series with the first conductive type constant current MOS transistor, and wherein the first switching MOS transistor includes a gate electrode which receives a digital signal;

wherein each of the first plurality of dummy current cells further includes a first conductive type MOS transistor connected in series with the first conductive type constant current MOS transistor, and wherein the first conductive type MOS transistor includes a gate electrode which is connected to the second power supply voltage;

wherein each of the second plurality of current cells further includes a second switching MOS transistor connected in series with the second conductive type constant current MOS transistor, and wherein the second switching MOS transistor includes a gate electrode which receives a digital signal; and wherein each of the second plurality of dummy current cells further includes a second conductive type MOS transistor connected in series with the second conductive type constant current MOS transistor, and wherein the second conductive type MOS transistor includes a gate electrode which is connected to the first power supply voltage.

6. The digital-to-analog converter as claimed in claim 4, wherein each of the first plurality of current cells further includes a first switching MOS transistor connected between the second node and the gate electrode of the first conductive type constant current MOS transistor, and wherein the first switching MOS transistor includes a gate electrode which receives a digital signal;

wherein each of the first plurality of dummy current cells further includes a first conductive type MOS transistor connected between the second node and the gate electrode of the first conductive type constant current MOS transistor, and wherein the first conductive type MOS transistor includes a gate electrode which is connected to the second power supply voltage;

wherein each of the second plurality of current cells further includes a second switching MOS transistor connected between the third node and the gate electrode of the second conductive type constant current MOS transistor, and wherein the second switching MOS transistor includes a gate electrode which receives a digital signal; and wherein each of the second plurality of dummy current cells further includes a second conductive type MOS transistor connected between the third node and the gate electrode of the second conductive type constant current MOS transistor, and wherein the second conductive type MOS transistor includes a gate electrode which is connected to the first power supply voltage.

* * * * *